(12) United States Patent
Sammelselg et al.

(10) Patent No.: US 11,326,254 B2
(45) Date of Patent: *May 10, 2022

(54) PROTECTING AN INTERIOR OF A GAS CONTAINER WITH AN ALD COATING

(71) Applicant: Picosun Oy, Espoo (FI)

(72) Inventors: Väino Sammelselg, Tartu (EE); Juhana Kostamo, Espoo (FI); Willi Bayerl, Sauerlach (DE); Jaan Aarik, Tartu (EE); Lauri Aarik, Tartu (EE); Sven Lindfors, Espoo (FI); Peter Adam, Munich (DE); Juho Poutiainen, Helsinki (FI)

(73) Assignee: Picosun Oy, Espoo (FI)

( * ) Notice: Subject to any disclaimer, the term of this patent is extended or adjusted under 35 U.S.C. 154(b) by 730 days.

This patent is subject to a terminal disclaimer.

(21) Appl. No.: 15/123,052

(22) PCT Filed: Mar. 3, 2014

(86) PCT No.: PCT/FI2014/050152
§ 371 (c)(1),
(2) Date: Sep. 1, 2016

(87) PCT Pub. No.: WO2015/132443
PCT Pub. Date: Sep. 11, 2015

(65) Prior Publication Data
US 2016/0369396 A1    Dec. 22, 2016

(51) Int. Cl.
*C23C 16/455* (2006.01)
*C23C 16/04* (2006.01)
(Continued)

(52) U.S. Cl.
CPC ........ *C23C 16/45525* (2013.01); *B05D 7/227* (2013.01); *C23C 16/045* (2013.01);
(Continued)

(58) Field of Classification Search
CPC .......... C23C 16/45525; C23C 16/4412; C23C 16/45555; C23C 16/045; C23C 16/04;
(Continued)

(56) References Cited

U.S. PATENT DOCUMENTS 4,118,522 A * 10/1978 Stellmach ............... A61J 3/005
                                                          118/13
4,326,480 A *  4/1982 Glatt ........................ A23G 3/26
                                                          118/19
(Continued)

FOREIGN PATENT DOCUMENTS

CN          101277872 A        10/2008
CN          102452797 A         5/2012
(Continued)

OTHER PUBLICATIONS

R. L. Puurunen. "Surface Chemistry of Atomic Layer Deposition: A Case Study for the Trimethylaluminum/Water Process." Journal of Applied Physics 97 (2005) 121301. pp. 1-52. (Year: 2005).*

(Continued)

*Primary Examiner* — Parviz Hassanzadeh
*Assistant Examiner* — Stanislav Antolin
(74) *Attorney, Agent, or Firm* — Ziegler IP Law Group, LLC

(57) ABSTRACT

An apparatus and method for protecting a gas container interior, where an inlet and exhaust manifold include a port assembly attachable to a port of the gas container is provided, the gas container interior is exposed to sequential self-saturating surface reactions by sequential inlet of reactive gases via the port assembly and the port into the gas container interior, and reaction residue is pumped via the port and the port assembly out from the gas container.

19 Claims, 5 Drawing Sheets

(51) Int. Cl.
  *C23C 16/44* (2006.01)
  *B05D 1/10* (2006.01)
  *B05D 7/22* (2006.01)
  *B65D 25/14* (2006.01)
  *C23C 14/04* (2006.01)
  *F17C 1/10* (2006.01)

(52) U.S. Cl.
  CPC ...... *C23C 16/4408* (2013.01); *C23C 16/4412* (2013.01); *C23C 16/455* (2013.01); *C23C 16/45544* (2013.01); *C23C 16/45555* (2013.01); *C23C 16/45561* (2013.01); *C23C 14/046* (2013.01); *C23C 16/4404* (2013.01); *C23C 16/4409* (2013.01); *F17C 1/10* (2013.01); *F17C 2203/0607* (2013.01)

(58) Field of Classification Search
  CPC ............ C23C 16/4404; C23C 16/4409; C23C 16/4417; C23C 16/455; C23C 16/45523; C23C 16/15525; C23C 16/45544; C23C 16/45561; C23C 16/45578; C23C 16/52; C23C 14/046; A61L 2420/02; A61L 2420/08; A61L 31/08; B05D 7/22; B05D 7/227; B05D 7/56; B05D 23/02; B05D 25/14; B29C 37/0025; C04B 35/62222; H01J 2237/332; H01J 37/32449; Y10T 428/29825
  USPC .......................................... 427/248.1–255.7
  See application file for complete search history.

(56) References Cited

U.S. PATENT DOCUMENTS

| | | | | |
|---|---|---|---|---|
| 4,810,524 A * | 3/1989 | Nakayama | ............. | B01J 19/088 204/169 |
| 4,859,489 A * | 8/1989 | Pinkhasov | ............. | C23C 14/046 427/580 |
| 4,869,203 A * | 9/1989 | Pinkhasov | ............. | C23C 14/046 118/723 VE |
| 4,923,717 A * | 5/1990 | Gladfelter | ............. | C23C 16/0281 427/252 |
| 5,069,972 A * | 12/1991 | Versic | ............. | B01J 13/04 252/1 |
| 5,288,504 A * | 2/1994 | Versic | ............. | A61K 9/5026 424/400 |
| 5,308,649 A * | 5/1994 | Babacz | ............. | C23C 16/045 215/12.2 |
| 5,314,727 A * | 5/1994 | McCormick | ............. | C23C 16/18 427/252 |
| 5,378,510 A * | 1/1995 | Thomas | ............. | B05D 1/62 215/12.2 |
| 5,521,351 A * | 5/1996 | Mahoney | ............. | B23K 10/027 219/121.59 |
| 5,565,248 A * | 10/1996 | Plester | ............. | C23C 14/0021 427/571 |
| 5,677,010 A * | 10/1997 | Esser | ............. | B05D 1/62 427/237 |
| 5,690,745 A * | 11/1997 | Grunwald | ............. | B05D 1/62 118/50.1 |
| 5,704,983 A * | 1/1998 | Thomas | ............. | B05D 1/62 118/723 MP |
| 5,741,544 A | 4/1998 | Mahulikar | | |
| 5,849,366 A | 12/1998 | Plester | | |
| 5,972,436 A * | 10/1999 | Walther | ............. | C03C 17/004 427/237 |
| 6,015,595 A * | 1/2000 | Felts | ............. | C23C 16/507 427/446 |
| 6,112,695 A * | 9/2000 | Felts | ............. | C23C 16/045 118/723 E |
| 6,149,982 A * | 11/2000 | Plester | ............. | B05D 1/62 427/171 |
| 6,180,191 B1 * | 1/2001 | Felts | ............. | C23C 16/045 427/237 |
| 6,276,296 B1 * | 8/2001 | Plester | ............. | C23C 16/045 118/723 R |
| 6,294,226 B1 * | 9/2001 | Shimamura | ............. | B29C 59/142 118/723 E |
| 6,343,476 B1 * | 2/2002 | Wang | ............. | F17C 1/00 62/46.1 |
| 6,372,346 B1 * | 4/2002 | Toth | ............. | B22F 1/025 428/403 |
| 6,416,577 B1 * | 7/2002 | Suntoloa | ............. | C23C 16/045 117/200 |
| 6,565,791 B1 * | 5/2003 | Laurent | ............. | A61L 2/14 264/455 |
| 6,589,619 B1 * | 7/2003 | Nagashima | ............. | B65D 1/0215 428/36.6 |
| 7,513,953 B1 * | 4/2009 | Felts | ............. | C23C 14/046 118/715 |
| 7,926,446 B2 * | 4/2011 | Behle | ............. | B08B 9/426 118/719 |
| 9,869,020 B2 * | 1/2018 | Malinen | ............. | C30B 35/00 |
| 10,047,435 B2 * | 8/2018 | Haukka | ............. | C23C 16/402 |
| 10,329,662 B2 * | 6/2019 | Kostamo | ............. | F04B 15/02 417/516 |
| 10,443,123 B2 * | 10/2019 | Haukka | ............. | A47L 7/0042 15/412 |
| 2001/0042510 A1 * | 11/2001 | Plester | ............. | C23C 16/045 118/723 E |
| 2002/0040729 A1 * | 4/2002 | Takeda | ............. | F16K 1/305 137/74 |
| 2002/0041942 A1 * | 4/2002 | Kuehnle | ............. | C23C 16/515 428/35.7 |
| 2002/0050142 A1 * | 5/2002 | Wang | ............. | F17C 7/02 62/48.1 |
| 2002/0070479 A1 * | 6/2002 | Plester | ............. | B29C 49/221 264/234 |
| 2002/0117114 A1 * | 8/2002 | Ikenaga | ............. | C23C 14/046 118/723 E |
| 2002/0176947 A1 * | 11/2002 | Darras | ............. | B05D 1/62 427/569 |
| 2002/0179603 A1 * | 12/2002 | Darras | ............. | B05D 1/62 220/62.11 |
| 2003/0077400 A1 * | 4/2003 | Plester | ............. | B29B 17/0026 427/566 |
| 2003/0091741 A1 * | 5/2003 | Schmoyer | ............. | C08J 7/14 427/255.28 |
| 2003/0097986 A1 * | 5/2003 | Moore | ............. | H01J 37/32192 118/722 |
| 2003/0203143 A1 * | 10/2003 | Nagashima | ............. | B65D 23/02 428/35.7 |
| 2003/0207115 A1 * | 11/2003 | Nagashima | ............. | B65D 23/02 428/408 |
| 2003/0219547 A1 * | 11/2003 | Arnold | ............. | B08B 7/00 427/569 |
| 2004/0000270 A1 * | 1/2004 | Carpenter | ............. | C23C 16/4481 118/723 VE |
| 2004/0023516 A1 * | 2/2004 | Londergan | ............. | C23C 16/4404 438/785 |
| 2004/0043141 A1 * | 3/2004 | Igarashi | ............. | B01J 2/12 427/157 |
| 2004/0052984 A1 * | 3/2004 | Toth | ............. | B22F 1/02 428/34.1 |
| 2004/0089967 A1 * | 5/2004 | Chatard | ............. | B05D 1/60 264/84 |
| 2004/0099214 A1 * | 5/2004 | Hama | ............. | C23C 16/045 118/723 E |
| 2004/0149225 A1 * | 8/2004 | Weikart | ............. | B05D 1/62 118/723 MW |
| 2004/0177676 A1 * | 9/2004 | Moore | ............. | G01N 15/0826 73/38 |
| 2004/0221807 A1 * | 11/2004 | Verghese | ............. | C30B 25/14 118/715 |
| 2004/0233938 A1 * | 11/2004 | Yamauchi | ............. | H04N 21/2365 370/537 |
| 2005/0064211 A1 * | 3/2005 | Deavenport | ............. | C23C 16/045 428/457 |

(56) References Cited

U.S. PATENT DOCUMENTS

| | | | | |
|---|---|---|---|---|
| 2005/0118365 | A1* | 6/2005 | Miyazaki | C23C 16/045 428/34.1 |
| 2005/0214455 | A1* | 9/2005 | Li | C23C 16/4405 427/248.1 |
| 2005/0223988 | A1* | 10/2005 | Behle | B08B 7/00 118/719 |
| 2005/0227019 | A1* | 10/2005 | Hama | B08B 5/02 427/581 |
| 2005/0233077 | A1* | 10/2005 | Lizenberg | B08B 7/00 427/248.1 |
| 2006/0011468 | A1* | 1/2006 | Boardman | C23C 16/045 204/192.12 |
| 2006/0051539 | A1* | 3/2006 | Yamasaki | B65D 1/0215 428/35.7 |
| 2006/0099359 | A1* | 5/2006 | Hiss | C23C 16/045 428/34.4 |
| 2006/0121222 | A1* | 6/2006 | Andrich | B65D 23/02 428/35.7 |
| 2006/0137608 | A1 | 6/2006 | Choi et al. | |
| 2006/0150909 | A1* | 7/2006 | Behle | B08B 7/00 118/719 |
| 2006/0189171 | A1* | 8/2006 | Chua | C23C 16/4404 438/800 |
| 2006/0196419 | A1* | 9/2006 | Tudhope | C23C 16/0272 118/715 |
| 2006/0198965 | A1* | 9/2006 | Tudhope | C23C 16/0245 427/569 |
| 2006/0280868 | A1* | 12/2006 | Kato | C23C 16/52 427/248.1 |
| 2007/0065578 | A1* | 3/2007 | McDougall | C23C 16/4404 427/248.1 |
| 2007/0157885 | A1* | 7/2007 | Yamasaki | B65D 23/02 118/723 E |
| 2007/0175905 | A1* | 8/2007 | Torres | C23C 16/045 220/586 |
| 2007/0187280 | A1* | 8/2007 | Haines | A61L 27/34 206/528 |
| 2007/0201016 | A1* | 8/2007 | Song | G01N 21/68 356/72 |
| 2007/0215046 | A1* | 9/2007 | Lupke | G01N 15/0826 118/712 |
| 2007/0232066 | A1* | 10/2007 | Bicker | C03C 21/007 438/689 |
| 2007/0269595 | A1* | 11/2007 | Harkonen | C23C 16/0272 427/248.1 |
| 2007/0281108 | A1* | 12/2007 | Weikart | C08J 7/123 427/575 |
| 2008/0011232 | A1* | 1/2008 | Rius | C23C 16/045 118/733 |
| 2008/0017113 | A1* | 1/2008 | Goto | C23C 16/045 118/723 R |
| 2008/0035056 | A1* | 2/2008 | Okubo | C23C 16/4417 118/716 |
| 2008/0038165 | A1* | 2/2008 | Burlingame | F28D 7/16 422/608 |
| 2008/0042305 | A1* | 2/2008 | Halalay | B01J 19/008 261/151 |
| 2008/0073127 | A1* | 3/2008 | Zhan | B24D 3/02 175/434 |
| 2008/0202414 | A1* | 8/2008 | Yan | C23C 16/045 118/622 |
| 2008/0217363 | A1* | 9/2008 | Vitantonio | B67D 1/0418 222/399 |
| 2008/0245676 | A1* | 10/2008 | McManus | B65D 7/045 206/0.7 |
| 2008/0260560 | A1* | 10/2008 | Lenhart | F04B 15/02 417/516 |
| 2009/0061111 | A1* | 3/2009 | Mishima | C23C 16/44 427/589 |
| 2009/0194233 | A1 | 8/2009 | Tamura et al. | |
| 2009/0263578 | A1* | 10/2009 | Lindfors | C23C 16/4485 427/248.1 |
| 2009/0280268 | A1* | 11/2009 | Glukhoy | C23C 16/045 427/578 |
| 2009/0297710 | A1* | 12/2009 | Lindfors | C23C 16/403 427/255.28 |
| 2010/0062614 | A1* | 3/2010 | Ma | C23C 16/45531 438/785 |
| 2010/0193461 | A1* | 8/2010 | Boutroy | B05D 1/62 215/12.2 |
| 2010/0298738 | A1* | 11/2010 | Felts | B05D 1/62 600/576 |
| 2010/0319620 | A1* | 12/2010 | Koishi | C23C 16/045 118/723 MW |
| 2011/0003088 | A1* | 1/2011 | Honda | B01J 2/006 427/569 |
| 2011/0030617 | A1* | 2/2011 | Biana | H01J 37/32458 118/723 R |
| 2011/0073478 | A1* | 3/2011 | Updyke | G01N 33/561 204/616 |
| 2011/0129618 | A1* | 6/2011 | Matsunaga | C23C 16/345 427/579 |
| 2011/0146697 | A1* | 6/2011 | Mola | A24D 3/163 131/345 |
| 2011/0186537 | A1* | 8/2011 | Rodriguez San Juan | A61M 5/3129 215/355 |
| 2011/0198736 | A1* | 8/2011 | Shero | C23C 16/45525 257/629 |
| 2011/0200822 | A1* | 8/2011 | Detavernier | C23C 16/4417 428/402 |
| 2011/0244693 | A1* | 10/2011 | Tamura | C23C 16/4404 438/761 |
| 2011/0252899 | A1* | 10/2011 | Felts | C23C 16/045 73/865.8 |
| 2011/0277272 | A1* | 11/2011 | Jonsson | A47L 7/0042 15/412 |
| 2012/0123345 | A1* | 5/2012 | Felts | A61M 5/3129 604/187 |
| 2012/0128896 | A1* | 5/2012 | Tucker | C23C 16/02 427/579 |
| 2012/0193842 | A1* | 8/2012 | Tetsumoto | C21B 13/12 266/144 |
| 2012/0231182 | A1* | 9/2012 | Stevens | H01J 37/32541 427/576 |
| 2012/0252709 | A1* | 10/2012 | Felts | A61M 5/3129 508/100 |
| 2013/0041241 | A1* | 2/2013 | Felts | C23C 16/045 600/364 |
| 2013/0059073 | A1* | 3/2013 | Jiang | C23C 16/4417 427/212 |
| 2013/0064973 | A1* | 3/2013 | Chen | C23C 16/405 427/248.1 |
| 2013/0316108 | A1* | 11/2013 | Shimizu | C23C 16/44 428/35.7 |
| 2013/0323423 | A1* | 12/2013 | Nakaya | C23C 16/045 427/255.29 |
| 2013/0337171 | A1 | 12/2013 | Sasagawa | |
| 2014/0010969 | A1* | 1/2014 | Bicker | B05D 1/62 427/488 |
| 2014/0154399 | A1* | 6/2014 | Weikart | A61M 5/3129 427/2.3 |
| 2014/0217065 | A1* | 8/2014 | Winkler | C23C 16/4405 216/75 |
| 2014/0249484 | A1* | 9/2014 | Jones | A61M 5/31513 604/230 |
| 2014/0251859 | A1* | 9/2014 | Weikart | A61J 1/00 206/524.9 |
| 2014/0274825 | A1* | 9/2014 | Jones | C23C 16/401 508/107 |
| 2015/0021339 | A1* | 1/2015 | Felts | C23C 16/30 220/626 |
| 2015/0098084 | A1* | 4/2015 | Felts | A61M 5/3129 356/432 |
| 2015/0126941 | A1* | 5/2015 | Felts | A61M 3/0262 604/230 |
| 2015/0147482 | A1* | 5/2015 | Kang | C23C 16/4404 427/535 |

(56) References Cited

U.S. PATENT DOCUMENTS

| | | | | |
|---|---|---|---|---|
| 2015/0290080 A1* | 10/2015 | Weikart | ............... | C23C 16/045 206/438 |
| 2015/0293031 A1* | 10/2015 | Fisk | ........................ | C23C 16/04 356/51 |
| 2015/0299848 A1* | 10/2015 | Haukka | ................... | C23C 16/02 427/123 |
| 2015/0316440 A1* | 11/2015 | Fisk | ....................... | G01M 3/202 73/40.7 |
| 2015/0335823 A1* | 11/2015 | Weikart | ................ | B01J 19/008 261/151 |
| 2016/0076148 A1* | 3/2016 | Malinen | .................. | C30B 25/00 427/237 |
| 2016/0369396 A1* | 12/2016 | Sammelselg | ..... | C23C 16/45525 |
| 2017/0073807 A1* | 3/2017 | Kostamo | ............. | C23C 16/4412 |
| 2019/0100837 A1* | 4/2019 | Haukka | ..................... | F28D 7/16 422/608 |
| 2020/0181766 A1* | 6/2020 | Haukka | ................... | C21B 13/12 266/144 |

FOREIGN PATENT DOCUMENTS

| | | | | |
|---|---|---|---|---|
| CN | 202753490 U | 2/2013 | | |
| JP | H02-185980 A | 7/1990 | | |
| JP | H04297577 A | 10/1992 | | |
| JP | H08-509166 A | 10/1996 | | |
| JP | 2001-220287 A | 8/2001 | | |
| JP | 2001220287 A | 8/2001 | | |
| JP | 2002-053119 A | 2/2002 | | |
| JP | 2004-297577 A | 10/2004 | | |
| JP | 2006160269 A | * 6/2006 | ........... | C23C 16/455 |
| JP | 2006160269 A | 6/2006 | | |
| JP | 2006321528 A | 11/2006 | | |
| JP | 2007-5545 A | 1/2007 | | |
| JP | 2007-224348 A | 9/2007 | | |
| JP | 2008261060 A | 10/2008 | | |
| JP | 2009-529605 A | 8/2009 | | |
| JP | 2010242205 A | * 10/2010 | ............ | B65D 23/08 |
| JP | 2010242205 A | 10/2010 | | |
| JP | 2011-513593 A | 4/2011 | | |
| JP | 2011-135046 A | 7/2011 | | |
| JP | 2011-523444 A | 8/2011 | | |
| JP | 2011523444 A | 8/2011 | | |
| JP | 2012-172208 A | 9/2012 | | |
| JP | 2012-526921 A | 11/2012 | | |
| JP | 2013-502599 A | 1/2013 | | |
| JP | 2013-211551 A | 10/2013 | | |
| JP | 2013211551 A | 10/2013 | | |
| WO | 95/22413 A1 | 8/1995 | | |
| WO | 2007/062264 A2 | 5/2007 | | |
| WO | 2009/112053 A1 | 9/2009 | | |
| WO | 2010/132579 A2 | 11/2010 | | |

OTHER PUBLICATIONS

V. Miikkulainen et al. "Crystallinity of Inorganic Films Grown by Atomic Layer Deposition: Overview and General Trends." Journal of Applied Physics 113 (2013) 021301. pp. 1-101. (Year: 2013).*

V. Dal Santo et al. "Tailored Supported Metal Nanoparticles by CVD: An Easy and Efficient Scale-Up by a Rotary Bed OMCVD Device." J. Mater. Chem. 19(2009). pp. 9030-9037. (Year: 2009).*

Wen-Liang Zeng et al. "Problems Involved in the Shell-side Performance of a Longitudinal-flow Shell-and-tube Heat Exchanger with Decrease in L/D and Its Solutions." International Journal of Low-Carbon Technologies. 7 [4] (2012). pp. 310-317. (Year: 2012).*

Office Action issued for Japanese Patent Application No. JP2018-036128, dated Nov. 26, 2018, 8 pages including 4 pages of English translation.

Decision to Grant a Patent received for Japanese patent Application No. 2016-549485, dated Jun. 15, 2018, 5 pages including 02 pages of English translation.

Second Office Action received for Chinese Patent Application No. CN2014800767469, dated Jan. 3, 2019, 08 pages including 2 pages of English translation.

Chinese Search Report received for Chinese Patent Application No. CN2014800767469, dated Mar. 12, 2018, 2 pages with partial English translation.

Extended European Search Report, Application No. 14885,016.7-1373/3114250 PCT/FI2014/050152, dated Feb. 23, 2017, 9 pages.

Extended European Search report received for European Patent Application No. EP14884857.5, dated Feb. 23, 2017, 9 pages.

International Preliminary Report on Patentability and Written Opinion received for International Patent Application No. PCT/FI2014/050152, dated Sep. 6, 2016, 10 pages.

International Preliminary Report on Patentability and Written Opinion received for International Patent Application No. PCT/FI2014/050153, dated Sep. 6, 2016, 10 pages.

International Search Report received for International Patent Application No. PCT/FI2014/050153, dated Oct. 28, 2014, 07 pages.

Non-Final Office Action received for U.S. Appl. No. 15/123,019, dated Jan. 11, 2018, 16 pages.

Office Action received for Japanese Patent Application No. JP2016-549485, dated Dec. 20, 2017, 7 pages including 3 pages of English translation.

First Office Action received for Chinese Patent Application No. 201480076746.9, dated Mar. 20, 2018, 08 pages including 02 pages of English translation.

First Office Action received for Chinese Patent Application No. 201480076747.3, dated Mar. 20, 2018, 08 pages including 02 pages of English translation.

Decision to Grant a Patent received for Japanese patent Application No. 2016-549485, dated Jun. 25, 2018, 5 pages including 02 pages of English translation.

Interanational Search Report and Written Opinion of the International Searching Authority, Application No. PCT/FI2014/050152, dated Oct. 28, 2014, 16 pages.

Notice of Allowance Application number Japanese Patent Application No. 2018-036128; dated Aug. 19, 2019; Title of the invention:To protect a gas container inside the ALD coating.

Machine Translation Notice of Allowance Application number Japanese Patent Application No. 2018-036128; dated Aug. 19, 2019; Title of the invention:To protect a gas container inside the ALD coating.

Korean Intellectual Property Office, Notice of Non-Final Rejection, Application No. 10-2016-7023833, dated Sep. 25, 2020, 4 pages.

* cited by examiner

PROTECTING AN INTERIOR OF A GAS CONTAINER WITH AN ALD COATING

FIELD

The aspects of the disclosed embodiments generally relate to atomic layer deposition (ALD). More particularly, the aspects of the disclosed embodiments relate to providing protective coating by means of ALD.

BACKGROUND OF THE

This section illustrates useful background information without admission of any technique described herein representative of the state of the art.

Atomic Layer Epitaxy (ALE) method was invented by Dr. Tuomo Suntola in the early 1970's. Another generic name for the method is Atomic Layer Deposition (ALD) and it is nowadays used instead of ALE. ALD is a special chemical deposition method based on the sequential introduction of at least two reactive precursor species to at least one substrate.

Thin films grown by ALD are dense, pinhole free and have uniform thickness. For example, in an experiment aluminum oxide has been grown by thermal ALD from trimethylaluminum $(CH_3)_3Al$, also referred to as TMA, and water resulting in only about 1% non-uniformity over a substrate wafer.

One interesting application of ALD technique is providing protective coatings on surfaces.

SUMMARY

According to a first example aspect of the disclosed embodiments there is provided a method of protecting a gas container interior, the method comprising:
  providing an inlet and exhaust manifold comprising a port assembly attachable to a port of the gas container;
  exposing the gas container interior to sequential self-saturating surface reactions by sequential inlet of reactive gases via said port assembly and said port into the gas container interior; and
  pumping reaction residue via said port and said port assembly out from the gas container.

The gas container may be, for example, a gas bottle or a gas cylinder. The sequential self-saturating surface reactions (according to ALD) produce the desired protective coating within the gas container interior. Accordingly, the gas container interior may be coated by using ALD so that all surfaces within the gas container which see the reactive gases end up coated.

In certain example embodiments, the method comprises attaching said port assembly to said port of the gas container. Said port of the gas container may be a gas container mouth. The gas container mouth may be threaded.

In certain example embodiments, the method comprises pumping reaction residue and purge gas from the gas container interior by a vacuum pump attached to an exhaust side of the inlet and exhaust manifold. The vacuum pump may provide one or more of the following effects: It may be used to pump the gas container interior into vacuum. It may be configured to pump reaction residue from the gas container via the port assembly.

The gas container may be used as the reaction chamber for ALD reactions. Accordingly, in certain example embodiments, the gas container is used as a reaction vessel sealed by the port assembly. The sequential self-saturating surface reactions are thereby limited to occur within the gas container interior.

In certain example embodiments, the gas container whose inner walls are coated forms a hot wall reaction chamber heated by an external heater.

In certain example embodiments, both gas inlet and gas exhaust occurs via a same port or opening of the gas container. In certain example embodiments, the inlet and exhaust manifold hermetically connected to the gas container opens directly into the gas container and allows alternate supply of the precursors needed for performing an ALD process, purging the inner volume of the gas container with an inert gas and evacuation of the precursors, gaseous reaction products and purge gas from the gas container.

In certain example embodiments, the gas container is closable (or closed) by the inlet and exhaust manifold.

In certain example embodiments, said port assembly comprises a sealing part. In certain example embodiments, the sealing part is detachably attachable to the gas container mouth in the place of a gas container stop valve. The sealing part, in certain example embodiments, comprises a tapered thread. In certain example embodiments, the tapered thread is configured to fit to a counter thread in the gas container mouth. The sealing part may be twisted into the gas container mouth to seal the gas container mouth. In certain example embodiments, there is a sealing tape, such as Teflon tape between the tapered thread and the threaded gas container mouth to improve sealing. In certain example embodiments, at least one in-feed line and an exhaust line pass through the sealing part. In certain example embodiments, said port assembly comprises a fitting part detachably attachable to the sealing part. The fitting part may form a (cylindrical) continuation of the sealing part. In certain example embodiments, when the fitting part is detached from the sealing part, the sealing part is twistable to tighten against the gas container mouth. Depending on the implementation, the fitting part may allow the sealing part to twist also when attached to the fitting part. In certain example embodiments, at least one in-feed line and an exhaust line pass both through the sealing part and the fitting part. In certain example embodiments, an interface between the sealing part and the fitting part is airtight when the fitting part has been attached to the sealing part. In certain example embodiments, there is an airtight feedthrough at an opposite end of the fitting part for at least one of an in-feed and an exhaust line to pass through.

In embodiments, in which the gas container is placed into a chamber of a reactor for deposition, such as a reaction or vacuum chamber, the sealing by the port assembly prevents a coating from being deposited onto the chamber walls. This reduces the need to clean the chamber walls.

In certain example embodiments, the gas container is used as a reaction vessel sealed by a sealing part comprised by the port assembly.

In certain example embodiments, said sealing part comprises a tapered thread detachably attachable to said port of the gas container in the place of a stop valve.

In certain example embodiments, said port assembly comprises a fitting part attachable to the sealing part allowing the sealing part to twist to tighten against said port of the gas container.

In certain example embodiments, the method comprises: guiding inactive purge gas into an intermediate space between the gas container and a surrounding chamber wall, and pumping said inactive purge gas out from the intermediate space.

An over pressure generated by guiding the inactive purge gas into the intermediate space further improves the sealing effect of the port assembly. The intermediate space in an embodiment is kept in a vacuum pressure by a vacuum pump which is in fluid communication with the intermediate space. By arranging a material flow from the intermediate space through an exhaust conduit to a pump, such as the vacuum pump, any precursor material ended up into the intermediate space can be removed.

The inlet and exhaust manifold provides at least one in-feed line and an exhaust line. Precursor vapor is discharged from said at least one in-feed line at a discharge point within the gas container. The exhaust line begins at an exhaust point within the gas container. In certain example embodiments, the discharge point (i.e., a gas discharge point) within the gas container is arranged at a different level than the exhaust point (i.e., a gas exhaust point). The discharge point in certain example embodiments resides at the bottom (or bottom section) of the gas container the exhaust point being in the top (or top section). In other example embodiments, the discharge point resides in the top (or top section) of the gas container interior the exhaust point being at the bottom (or bottom section).

In certain example embodiments, the inlet and exhaust manifold comprises one or more in-feed lines with their controlling elements controlled by a computer-implemented control system.

In certain example embodiments, the inlet and exhaust manifold comprises ALD reactor in-feed equipment. In certain example embodiments, the in-feed equipment comprises in-feed line(s) and at least the desired precursor and inactive gas flow controlling elements, such as valve(s), mass flow controller(s) or similar, and their control system.

The control system may be implemented for example by software in a laptop computer or similar. Accordingly, in certain example embodiments, the inlet and exhaust manifold comprises one or more in-feed lines with their controlling elements controlled by a computer-implemented control system. Suitable replaceable precursor and inactive gas sources may be attached to the in-feed equipment.

According to a second example aspect of the disclosed embodiments there is provided an apparatus for protecting a gas container interior, comprising: an inlet and exhaust manifold comprising a port assembly attachable to a port of the gas container, the apparatus being configured to expose the gas container interior to sequential self-saturating surface reactions by sequential inlet of reactive gases via said port assembly and said port into the gas container interior; and a pump configured to pump reaction residue via said port and said port assembly out from the gas container.

In certain example embodiments, a gas discharge point provided by the inlet and exhaust manifold is arranged at a different level than a gas exhaust point provided by the inlet and exhaust manifold. The different levels here typically mean different heights.

In certain example embodiments, the inlet and exhaust manifold comprises precursor vapor and purge gas in-feed lines and their controlling elements. The pump may attached to the exhaust side of the inlet and exhaust manifold. The pump may be a vacuum pump.

In certain example embodiments, the inlet and exhaust manifold comprises a gas container-specific port assembly configured to attach the inlet and exhaust manifold into said port of the gas container thereby forming a fluid communication path between the inlet and exhaust manifold and the gas container interior. Similarly, a fluid communication path between the gas container interior and the pump is formed.

In certain example embodiments, the port assembly comprises a sealing part attachable to the port of the gas container.

In certain example embodiments, the sealing part comprises a tapered thread.

In certain example embodiments, the apparatus comprises: a chamber surrounding the gas container and an inactive gas in-feed line configured to guide inactive purge gas into an intermediate space between the gas container and a surrounding chamber wall.

The apparatus comprising the inlet and exhaust manifold may be mobile so that it can be moved to meet the user's needs. In certain example embodiments, the inlet and exhaust manifold comprises a separate inlet manifold and a separate exhaust manifold both being able to simultaneously couple to the gas container port and designed to work together in a gas container interior protecting method.

Different non-binding example aspects and embodiments of the present disclosed embodiments have been illustrated in the foregoing. The above embodiments are used merely to explain selected aspects or steps that may be utilized in implementations of the present disclosed embodiments. Some embodiments may be presented only with reference to certain example aspects of the disclosed embodiments. It should be appreciated that corresponding embodiments may apply to other example aspects as well. Any appropriate combinations of the embodiments may be formed.

BRIEF DESCRIPTION OF THE DRAWINGS

The aspects of the disclosed embodiments will now be described, by way of example only, with reference to the accompanying drawings, in which.

DETAILED DESCRIPTION

In the following description, Atomic Layer Deposition (ALD) technology is used as an example. The basics of an ALD growth mechanism are known to a skilled person. As mentioned in the introductory portion of this patent application, ALD is a special chemical deposition method based on the sequential introduction of at least two reactive precursor species to at least one substrate.

The at least one substrate is exposed to temporally separated precursor pulses in a reaction vessel to deposit material on the substrate surfaces by sequential self-saturating surface reactions. In the context of this application, the at least one substrate comprises the interior (inner surface) of a gas container, for example a gas bottle. Further, in the context of this application, the term ALD comprises all applicable ALD based techniques and any equivalent or closely related technologies, such as, for example MLD (Molecular Layer Deposition) technique.

A basic ALD deposition cycle consists of four sequential steps: pulse A, purge A, pulse B and purge B. Pulse A consists of a first precursor vapor and pulse B of another precursor vapor. Inactive gas and a vacuum pump are typically used for purging gaseous reaction by-products and the residual reactant molecules from the reaction space during purge A and purge B. A deposition sequence comprises at least one deposition cycle. Deposition cycles are repeated until the deposition sequence has produced a thin film or coating of desired thickness. Deposition cycles can also be more complex. For example, the cycles can include three or more reactant vapor pulses separated by purging steps. All these deposition cycles form a timed deposition sequence that is controlled by a logic unit or a microprocessor.

In certain example embodiments as described in the following, there is provided a method and apparatus for protecting a gas container (such as a gas cylinder, or gas bottle) interior with a protective coating. The gas container here is a pressure vessel. The gas container itself forms a reaction chamber (or a reaction space), and there is typically no separate substrate, but the surfaces of the gas container interior form a substrate (substrate here meaning the material on which a process is conducted). All these surfaces can be coated by an ALD process in which precursor vapors are sequentially inlet via an inlet and exhaust manifold into the gas container interior. The reaction residue is pumped out from the gas container interior via an exhaust side of the inlet and exhaust manifold. The gas container can be optionally heated before and/or during ALD processing by a heater placed around the gas container.

Figure 1:
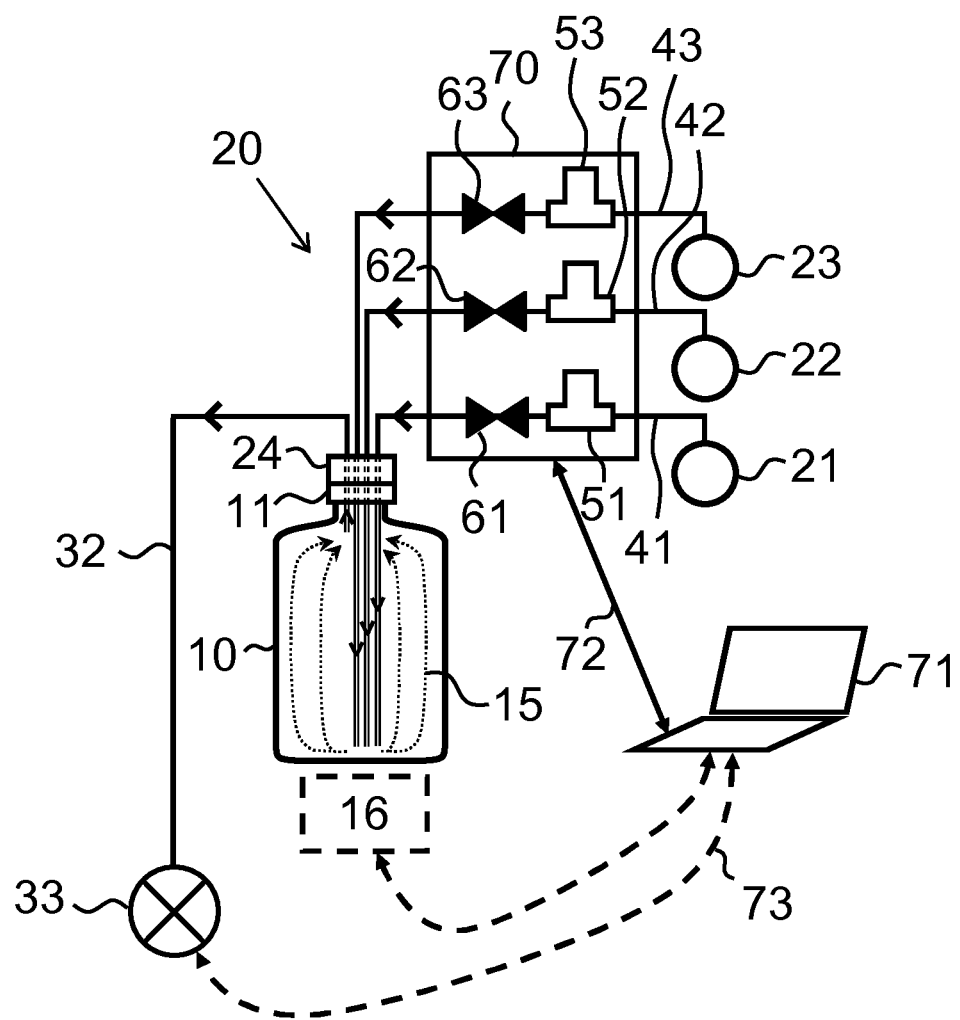
FIG. 1 shows a schematic view of an apparatus and its use for protecting a gas container interior in accordance with an example embodiment.

FIG. 1 shows the method and related apparatus in certain example embodiments. The apparatus used to protect the interior of a gas container 10 comprises an inlet and exhaust manifold 20. The apparatus may be a mobile apparatus. A mobile apparatus may be conveniently moved into the proximity of gas containers to be protected, if needed.

The inlet and exhaust manifold 20 is configured to be detachably attached to a gas container port 11. FIG. 1 shows the inlet and exhaust manifold 20 attached by a port assembly 24 to the gas container port 11. The port assembly 24 may be a gas container-specific part. The port assembly comprises a sealing arrangement (not shown) to seal the interface between the gas container port 11 and the port assembly 24. In an example implementation, the port assembly comprises a seal (not shown) which tightens against its counter surface in the gas container port 11.

The inlet and exhaust manifold 20 comprises ALD reactor in-feed equipment 70. The in-feed equipment 70 comprises the required in-feed lines and their controlling elements. Attached to the port assembly 24 in FIG. 1 is a first precursor vapor in-feed line 41, a second precursor in-feed line 42 and a purge gas in-feed line 43. The first precursor in-feed line 41 originates from a first precursor source 21, the second precursor in-feed line 42 from a second precursor source 22, and the purge gas in-feed line 43 from a purge/inactive gas source 23. The in-feed lines 41-43 extend, travelling through the port assembly 24 and gas container port 11, from the sources 21-23 to the interior of the gas container 10. The in-feed lines 41-43 end at respective discharge points. An exhaust line 32 begins at an exhaust point within the gas container interior. The discharge points should reside in a different level than the exhaust point to effectively obtain uniform deposition. In the embodiment shown in FIG. 1 the discharge points of the in-feed lines 41-43 are at the bottom section of the gas container 10 the exhaust point being in the top section.

The in-feed line controlling elements comprise flow and timing controlling elements. A first precursor in-feed valve 61 and mass (or volume) flow controller 51 in the first precursor in-feed line 41 control the timing and flow of first precursor pulses. Correspondingly, a second precursor in-feed valve 62 and mass (or volume) flow controller 52 in the second precursor in-feed line 42 control the timing and flow of second precursor pulses. Finally, a purge gas in-feed valve 63 and mass (or volume) flow controller 53 control the timing and flow of purge gas.

In the embodiment shown in FIG. 1, the operation of the in-feed equipment 70 is controlled by a control system. FIG. 1 shows a control connection 72 between the in-feed equipment 70 and a control system 71. The control system 71 may be implemented for example by software in a laptop computer or similar.

In certain example embodiments, the ALD process within the gas container interior is performed in a vacuum pressure. The inlet and exhaust manifold 20 comprises a vacuum pump 33. In certain example embodiments, the vacuum pump 33 is located in the end of the exhaust line 32 provided by the inlet and exhaust manifold 20. The vacuum pump 33 can be optionally controlled by the control system 71 via an optional electrical connection 73 (which is between the control system 71 and the vacuum pump 33). In certain example embodiments, the gas container is heated by an external heater (not shown).

In operation, the vacuum pump 33 pumps the interior of the gas container 10 into vacuum. Precursor vapor of the first precursor and second precursor are sequentially discharged into the gas container interior from the discharge points of the first and second precursor in-feed lines 41 and 42, respectively. In the purge steps, inactive purging gas is discharged into the gas container interior from the discharge point of the purge gas in-feed line 43. The arrows 15 depict the flow direction of precursor vapor and purge gas within the gas container from the respective discharge points towards the exhaust point (via which they are pumped into the exhaust line 32). The desired thickness of protective coating onto the gas container inner surface is obtained by repeating deposition cycles as needed.

Further referring to FIG. 1, it should be noted that in other embodiments, the inlet and exhaust manifold 20 may be arranged differently. Instead of separate in-feed lines at least part of the in-feed lines may be in common. The valve types may vary. The flow controlling element locations may vary, etc. For example, three-way valves may be used instead of two-way valves, immediately reflecting changes in in-feed line routing. Concerning the precursor sources and purge gas, their selection depends on the implementation and desired coating. The gas container 10 can be heated by an optional heater 16 from the outside of the gas container 10. The heater may be a helical coil heater arranged around the gas container 10. The operation of the heater can be optionally controlled be the control system 71 over a connection.

Applicable coatings depending on the application are, for example, metal oxides, such as aluminum oxide, titanium oxide, tantalum oxide, and tungsten carbide, and their combinations, but the coatings are not limited to these materials.

Figure 2A:
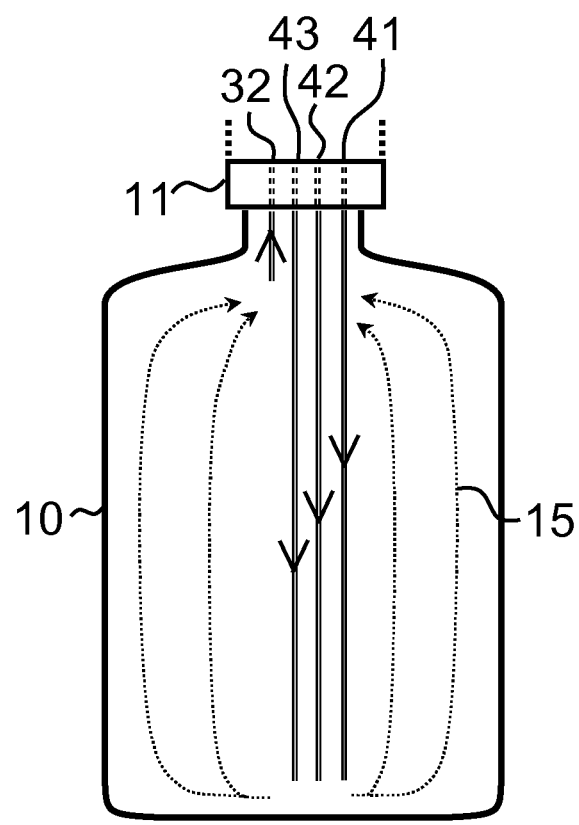
FIGS. 2A-2B show alternative in-feed arrangements in accordance with certain example embodiments.
Figure 2B:
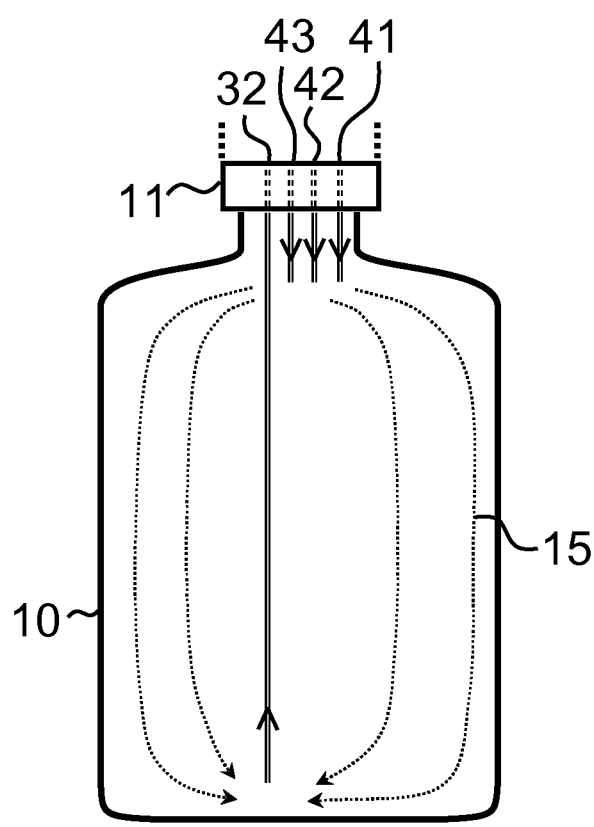

FIGS. 2A and 2B show two alternative embodiments for the placement of in-feed and exhaust lines within the gas container 10. The gas container 10 has an inner wall shape allowing free movement of low-pressure gases.

FIG. 2A corresponds to the arrangement shown in FIG. 1. Accordingly, the in-feed lines 41-43 and exhaust line 32 travel through the gas container port 11. The in-feed lines 41-43 end at respective discharge points. The exhaust line 32 begins at an exhaust point. The discharge points of the in-feed lines 41-43 are at the bottom section of the gas container 10 the exhaust point being in the top section. The direction of gas flow is shown by the arrows 15.

In the preferred embodiment shown in FIG. 2B, the exhaust line to the contrary begins at the bottom section of the gas container 10 whereas the discharge points of the in-feed lines 41-43 are in the top section. The in-feed lines 41-43 and exhaust line 32 travel through the gas container port 11. The in-feed lines 41-43 end at respective discharge points. The exhaust line 32 begins at an exhaust point. The direction of gas flow is shown by the arrows 15.

Figure 3:
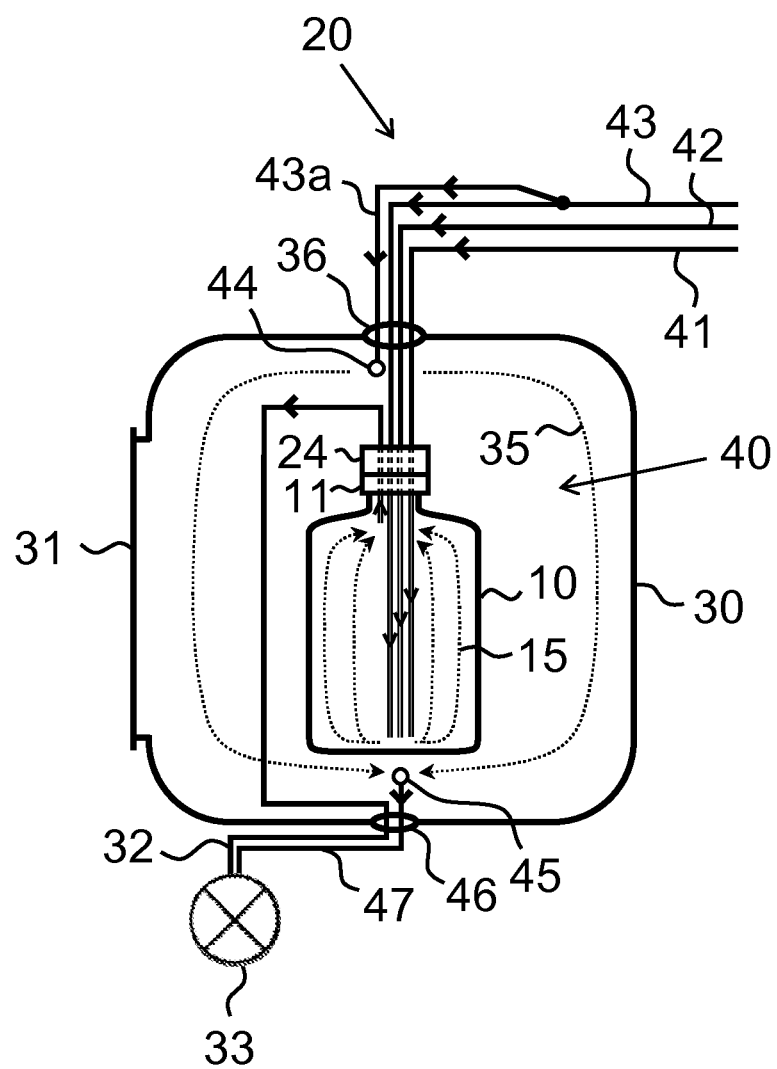
FIG. 3 shows another example embodiment.

FIG. 3 shows a method and apparatus for protecting a gas container interior in accordance with another example embodiment. This embodiment basically corresponds to the embodiment shown in FIG. 1, however, disclosing certain further features.

FIG. 3 shows pressure vessel, such as a chamber 30 surrounding the gas container 10. The chamber 30 may be, for example, a vacuum chamber or ALD reaction chamber generally used in the field of ALD. The gas container 10 is loaded into the chamber 30 via a loading hatch 31, or similar, and is attached by its port 11 to the port assembly 24. The in-feed lines 41-43 are passed into the chamber 30 through a feedthrough 36 arranged into the chamber 30 wall. The exhaust line 32 is passed out from the chamber 30 through a feedthrough 46 arranged into the chamber 30 wall. The location of the feedthroughs 36 and 46 depend on the implementation. The feedthroughs 36 and 46 may even be implemented by a single feedthrough. The feedthroughs 36 and 46 are sealed.

The basic operation concerning the deposition of a protective coating within the gas container 10 is similar to that described in connection with FIG. 1.

The embodiment shown in FIG. 3 optionally comprises a purge gas in-feed conduit 44 through which inactive purge gas is guided (discharged) into an intermediate space 40 between the gas container 10 and a surrounding chamber 30 wall. The purge gas flows to the conduit 44, for example, along a branch 43a divided from the purge gas in-feed line 43.

The intermediate space 40 is pumped by the vacuum pump 33 via an exhaust conduit 45 arranged on the opposite side of the intermediate space 40. The exhaust pump 33 is in fluid communication with the intermediate space 40 through an exhaust line 47 extending from the exhaust conduit 45 to the exhaust pump 33. The exhaust lines 32 and 47 may join at some point on the way to the exhaust pump 33.

The pumping causes a flow within the intermediate space 40 that conducts any precursor material ended up into the intermediate space 40 into the exhaust line 47. An over pressure generated by guiding the inactive purge gas into the intermediate space 40 further improves the sealing effect of the port assembly 24. The arrows 35 depict the flow direction within the intermediate space 40.

Figure 4A:
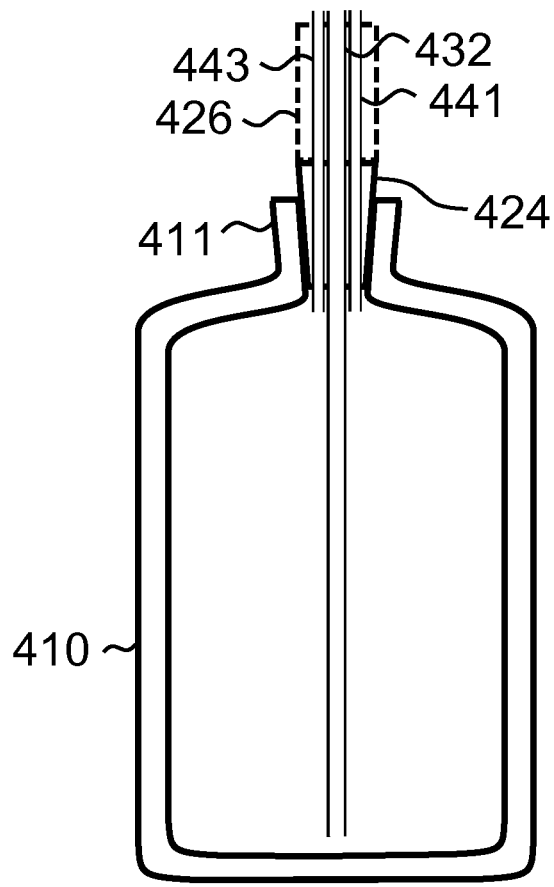
FIGS. 4A-4B show a sealing arrangement in accordance with certain example embodiments.

FIG. 4A shows a sealing arrangement in accordance with an example embodiment. The gas container 410 comprises a gas container port 411 which is here a mouth of the gas container. An inlet and exhaust manifold comprises a port assembly comprising a sealing part 424. The sealing part is detachably attachable, by for example twisting, to the gas container mouth 411 in the place of a gas container stop valve. For this purpose, the sealing part 424 is a tapered thread part. The tapered thread of the sealing part is configured to fit to a counter thread (not shown) in the gas container mouth 411 to tighten and seal the gas container mouth 411. As mentioned, the sealing part 424 can be, for example, twisted into the gas container mouth to seal the gas container mouth.

Figure 4B:
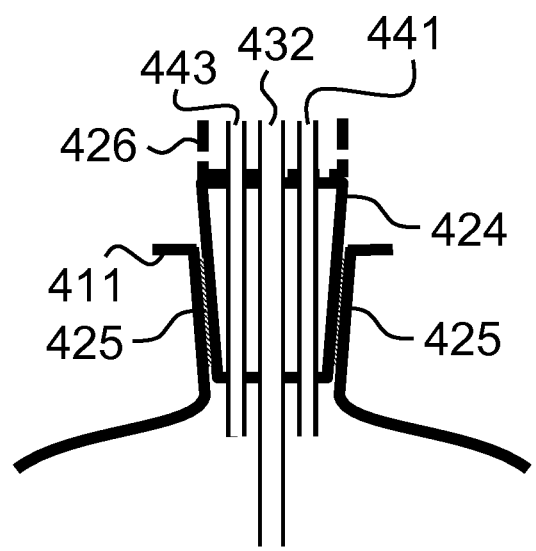

In certain example embodiments, there is sealing tape 425, such as Teflon tape around the tapered thread between the tapered thread and the threaded gas container mouth 411 to improve sealing as illustrated in FIG. 4B which is an enlargement of certain parts of FIG. 4A.

FIGS. 4A and 4B show two in-feed lines 441 and 443 as well as an exhaust line 432 arranged similarly as in the preferred FIG. 2B. Accordingly, the gas discharge point is in the very proximity of the gas container mouth and the exhaust point at the opposite end of the gas container (i.e., at the bottom). The in-feed lines and exhaust line pass through the sealing part 424 extending through the sealing part into an interior of the gas container 410. In certain example embodiments, the port assembly further comprises a fitting part 426 detachably attachable to the sealing part. The fitting part 426 forms a (cylindrical) continuation of the sealing part 424. In certain example embodiments, when the fitting part 426 is detached from the sealing part 424, the sealing part 424 is twistable to tighten against the gas container mouth 411. Depending on the implementation, the fitting part 426 may allow the sealing part 424 to twist also when attached to the fitting part 426. The in-feed lines 441 and 443 as well as the exhaust line 432 pass both through the sealing part 424 and the fitting part 426. The interface between the sealing part 424 and the fitting part 426 is airtight when the fitting part 426 has been attached to the sealing part 424. In certain example embodiments, there is an airtight feedthrough at an end opposite to the sealing part end of the fitting part 426 (as depicted in the upper section of FIG. 4A) for at least one of an in-feed line 441,443 and an exhaust line 432 to pass through. An airtight feedthrough here means basically a feedthrough at which gas can flow between the inside of a part and the outside of a part 426 only through a pipeline. An airtight interface, similarly, means an interface at which gas can flow from the part (for example, fitting part 426) on a first side of the interface to the part (for example, sealing part 424) on the other side only through the interface.

In embodiments, in which the fitting part is omitted, the feedthrough(s) are preferably arranged in the (upper) end of the sealing part 424.

As to the general operation of the embodiments shown in FIGS. 4A and 4B, a reference is made also to the embodiments shown in FIGS. 1 to 3.

Figure 5:
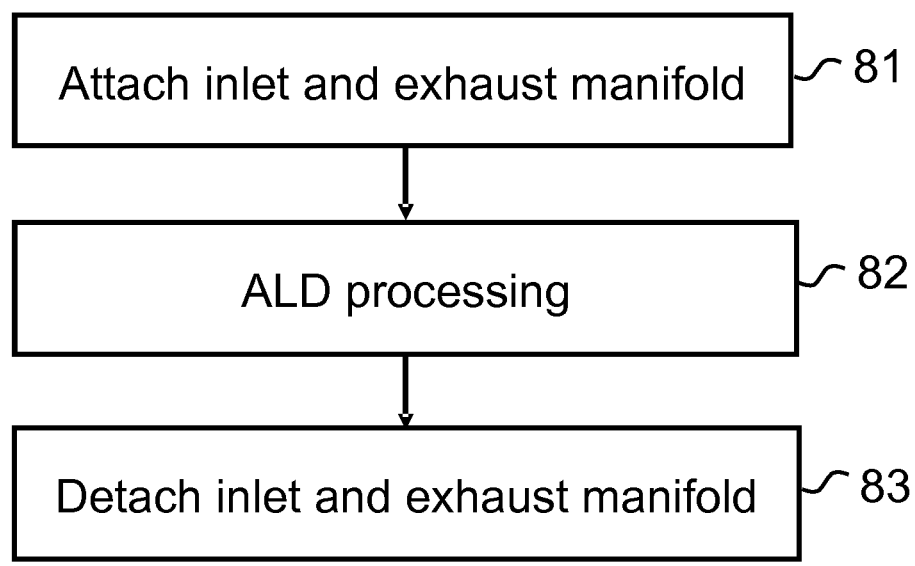
FIG. 5 shows a method in accordance with an example embodiment.

FIG. 5 shows a method in accordance with an example embodiment. In step 81, an inlet and exhaust manifold is attached to a gas container. ALD processing is performed in step 82. The ALD processing comprises exposing the gas container interior to sequential self-saturating surface reactions and pumping reaction residue out from the gas container. Finally, in step 83, the inlet and exhaust manifold is detached from the gas container.

Without limiting the scope and interpretation of the patent claims, certain technical effects of one or more of the example embodiments disclosed herein are listed in the following: A technical effect is protecting gas container interior by a conformal protective coating. Another technical effect is coating only the inside of the gas container the outside being not coated. Another technical effect is reduced cleaning need of a surrounding chamber.

It should be noted the some of the functions or method steps discussed in the preceding may be performed in a different order and/or concurrently with each other. Furthermore, one or more of the above-described functions or method steps may be optional or may be combined.

The foregoing description has provided by way of non-limiting examples of particular implementations and embodiments of the present disclosure a full and informative description of the best mode presently contemplated by the inventors for carrying out the aspects of the disclosed embodiments. It is however clear to a person skilled in the art that the aspects of the disclosed embodiments are not restricted to details of the embodiments presented above, but that it can be implemented in other embodiments using equivalent means without deviating from the characteristics of the disclosed embodiments.

Furthermore, some of the features of the above-disclosed embodiments of this present disclosure may be used to advantage without the corresponding use of other features. As such, the foregoing description should be considered as merely illustrative of the principles of the aspects of the disclosed embodiments, and not in limitation thereof. Hence, the scope of the disclosed embodiments is only restricted by the appended patent claims.

The invention claimed is:

1. An apparatus for protecting a gas container interior, comprising:
   a vacuum chamber surrounding a reaction chamber formed by the gas container, the apparatus configured to detachably attach to a port of the gas container, such that a port assembly seals the gas container;
   a feedthrough in the vacuum chamber wall;
   at least one in-feed line and an exhaust line, the at least one in-feed line providing a gas discharge point within the gas container at an end of the gas container where the port assembly attaches and the exhaust line providing a gas exhaust point within the gas container at an end opposite to the end in which the port assembly attaches, the at least one in-feed line comprising at least a first precursor in-feed line originating from a first precursor source and extending to said feedthrough and a second precursor in-feed line originating from a second precursor source and extending separate from said first precursor in-feed line to said feedthrough;
   an inactive purge gas in-feed conduit comprising a discharge opening in connection with said feedthrough to guide inactive purge gas into an intermediate space between the gas container and the vacuum chamber;
   an exhaust conduit on opposite side of the vacuum chamber to provide a top-to-bottom flow of inactive purge gas from the discharge opening and further along an outer surface of the gas container to the exhaust conduit;
   a control system to control exposure of the gas container interior to sequential self-saturating surface reactions by sequential inlet of a first and second precursor vapor via said port assembly, the port assembly sealing the gas container to limit said self-saturating surface reactions to occur within the gas container interior; and
   a pump configured to pump excess gases via said port and said port assembly along an exhaust line out from the gas container.

2. The apparatus of claim 1, comprising a controlling element for the at least one in-feed line.

3. The apparatus of claim 1, comprising:
   an inactive gas in-feed line configured to guide inactive purge gas into an intermediate space between the gas container and a surrounding vacuum chamber wall.

4. The apparatus of claim 3, further comprising an exhaust conduit forming a fluid communication path between the intermediate space and the pump.

5. The apparatus of claim 3, comprising a controlling element for the inactive gas in-feed line.

6. The apparatus of claim 3, wherein the exhaust line extends from the gas container to the pump through said intermediate space without mixing said excess gases with the inactive purge gas in the intermediate space.

7. The apparatus of claim 1, wherein the port assembly comprises a sealing part attachable to the port of the gas container.

8. The apparatus of claim 7, wherein the sealing part comprises a tapered thread.

9. The apparatus of claim 1, wherein the apparatus is mobile.

10. The apparatus of claim 1, wherein the port assembly comprises the first precursor in-feed line, the second precursor in-feed line, and the exhaust line as separate lines.

11. The apparatus of claim 10, comprising the first precursor in-feed line extending from the first precursor source all the way to the port assembly and the second precursor in-feed line extending from the second precursor source all the way to the port assembly as separate lines.

12. A method of protecting a gas container interior, the method comprising:
   surrounding the gas container with a vacuum chamber, the vacuum chamber comprising a feedthrough in the vacuum chamber wall, the gas container forming a reaction chamber;
   detachably attaching a port assembly to a port of the gas container such that the port assembly seals the gas container;
   providing the gas container interior with at least one in-feed line and an exhaust line, the at least one in-feed line providing a gas discharge point within the gas container at an end of the gas container where the port assembly attaches, and the exhaust line providing a gas exhaust point within the gas container at an end opposite to the end in which the port assembly attaches, the at least one in-feed line comprising at least a first precursor in-feed line and a second precursor in-feed line;
   providing an inactive purge gas in-feed conduit comprising a discharge opening m connection with said feedthrough to guide inactive purge gas into an intermediate space between the gas container and the vacuum chamber;
   providing an exhaust conduit on opposite side of the vacuum chamber to provide a top-to-bottom flow of inactive purge gas from the discharge opening and further along an outer surface of the gas container to the exhaust conduit;
   exposing the gas container interior to sequential self-saturating surface reactions by sequential inlet via said port assembly of a first precursor vapor originating from a first precursor source and extending along the first precursor in-feed line to said feedthrough in the vacuum chamber wall, and a second precursor vapor originating from a second precursor source and extending along a second precursor in-feed line separate from said first precursor in-feed line to said feedthrough, wherein a computer implemented control system is used to control the in-feed lines of the first and second precursor vapors; and
   pumping excess gases via said port assembly in said port along an exhaust line out from the gas container.

13. The method of claim 12, comprising pumping reaction residue and purge gas from the gas container interior by a vacuum pump attached to the exhaust line.

14. The method of claim 12, wherein the gas container is used as a reaction vessel sealed by a sealing part comprised by the port assembly.

15. The method of claim 14, wherein said sealing part comprises a tapered thread detachably attachable to said port of the gas container in the place of a stop valve.

16. The method of claim 14, wherein said port assembly comprises a fitting part attachable to the sealing part allowing the sealing part to twist to tighten against said port of the gas container.

17. The method of claim 12, comprising:
   guiding inactive purge gas into an intermediate space between the gas container and a surrounding chamber wall, and
   pumping said inactive purge gas out from the intermediate space.

18. The method of claim 12, comprising providing the first precursor in-feed line, the second precursor in-feed line, and the exhaust line as separate lines in the port assembly.

19. The method of claim 18, comprising providing the first precursor in-feed line extending from the first precursor source all the way to the port assembly and the second precursor in-feed line extending from the second precursor source all the way to the port assembly as separate lines.

* * * * *